United States Patent
Lindquist et al.

(10) Patent No.: US 12,101,098 B2
(45) Date of Patent: Sep. 24, 2024

(54) AUTOMATED WAVEFORM VALIDATION

(71) Applicant: International Business Machines Corporation, Armonk, NY (US)

(72) Inventors: Timothy Lindquist, Rochester, MN (US); Zachary Kauffman, Rochester, MN (US); Jeremy T Ekman, West Concord, MN (US); Scott M. Willenborg, Stewartville, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 135 days.

(21) Appl. No.: 17/820,390

(22) Filed: Aug. 17, 2022

(65) Prior Publication Data

US 2024/0063810 A1 Feb. 22, 2024

(51) Int. Cl.
H03M 1/10 (2006.01)
H03M 1/00 (2006.01)
H03M 1/12 (2006.01)

(52) U.S. Cl.
CPC ............ H03M 1/1071 (2013.01); H03M 1/00 (2013.01); H03M 1/12 (2013.01)

(58) Field of Classification Search
CPC ......... H03M 1/1071; H03M 1/00; H03M 1/12
See application file for complete search history.

(56) References Cited

U.S. PATENT DOCUMENTS

| | | | |
|---|---|---|---|
| 10,028,706 B2 | 7/2018 | Brockway et al. | |
| 10,425,068 B1 | 9/2019 | Schat | |
| 10,987,007 B2 | 4/2021 | Rundo et al. | |
| 11,284,827 B2 | 3/2022 | Telenkov et al. | |
| 11,488,050 B2 | 11/2022 | Shah et al. | |
| 2004/0161028 A1 | 8/2004 | Roberts et al. | |
| 2008/0238741 A1 | 10/2008 | Horisaki | |
| 2009/0267814 A1* | 10/2009 | De Haas | G06Q 10/10 341/110 |
| 2016/0256112 A1 | 9/2016 | Brockway et al. | |
| 2019/0117096 A1 | 4/2019 | Rundo et al. | |
| 2020/0245889 A1 | 8/2020 | Telenkov et al. | |
| 2020/0284883 A1 | 9/2020 | Ferreira et al. | |
| 2021/0119636 A1 | 4/2021 | Zhao et al. | |

FOREIGN PATENT DOCUMENTS

KR 2001-0058532 A 7/2001

OTHER PUBLICATIONS

International Search Report and Written Opinion received for PCT Application Serial No. PCT/EP2023/070511 dated Nov. 7, 2023, 12 pages.

(Continued)

*Primary Examiner* — Joseph J Lauture
(74) *Attorney, Agent, or Firm* — Amin, Turocy & Watson, LLP

(57) ABSTRACT

Systems, compute-implemented methods, and computer program products to facilitate automated waveform validation are provided. According to an embodiment, a system can comprise a processor that executes computer executable components stored in memory. The computer executable components comprise a waveform comparison component that compares a digital conversion of an analog signal to a reference signal.

14 Claims, 11 Drawing Sheets

(56) References Cited

OTHER PUBLICATIONS

Eielsen et al., "Experimental Assessment of Dynamic Digital-to-Analog Converter Performance for Applications in Precision Mechatronic Systems", Australian Control Conference, 2016, pp. 329-334.
Kester, W., et al. | "Analog-Digital Conversion. Chapter 2. Fundamentals of Sampled Data Systems". 2020, 120 pages.
Gomez, F. | "Cross-Domain Troubleshooting and Validation of RF Signals: View and Understand your RF signals across multiple domains without compromise". Tektronix presentation, Mar. 2022, 31 pages.
Fourier Series | Correlation—E1.10 Fourier Series and Transforms (2015-5585). Chapter 8, 2015, 103 pages.
ip.com | "A Novel Approach for Anomaly Detection on Captured Mixed Signal Waveforms". IP.com No. IPCOM000261918D, IP.com Electronic Publication Date: Apr. 17, 2020, 10 pages.
ip.com | "RF Sequence Data Waveform Translator". IP.com No. IPCOM000250937D, IP.com Electronic Publication Date: Sep. 15, 2017, 9 pages.
ip.com | "Efficient, Reusable Methodology for Developing Automated, Robust Analog Mixed Signal Verification Environment". IP.com No. IPCOM000212429D, IP.com Electronic Publication Date: Nov. 11, 2011, 13 pages.

\* cited by examiner

AUTOMATED WAVEFORM VALIDATION

BACKGROUND

The subject disclosure relates to automated waveform validation, and more specifically, automated waveform validation based on cross-correlation.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, computer-implemented methods, and/or computer program products that facilitate automated waveform validation.

According to an embodiment, a system can comprise a digital to analog convertor configured to convert digital data to an analog signal, an analog to digital convertor configured to convert the analog signal to a digital conversion, a memory configured to store computer executable components and a processor configured to execute computer executable components stored in memory. The computer executable components can comprise a waveform comparison component configured to verify accuracy of the analog signal based on a comparison of the digital conversion and a reference signal. An advantage of such a system is that the comparison of the digital conversion to the reference signal can be performed automatically, thereby reducing entity time to compare waveforms.

In some embodiments, the waveform validation component can be further configured to determine validity of the analog signal based on the comparing of the digital conversion to the reference signal. An advantage of such a system is that it can automatically verify that the digital to analog convertor is operating with an acceptable measurement of accuracy.

According to another embodiment, a computer-implemented method can comprise producing, by a system, operatively coupled to a processor, an analog signal, converting, by the system, the analog signal to a digital conversion, and verifying, by the system, accuracy of the analog signal based on a comparison of the digital conversion and a reference signal. An advantage of such a computer implemented method is that the comparison of the digital conversion to the reference signal can be performed automatically, thereby reducing entity time to compare waveforms.

In some embodiments, the above computer-implemented method can further comprise, determining, by the system, validity of the analog signal based on a result of the comparing of the digital conversion to the reference signal. An advantage of such a computer-implemented method is that it can automatically verify that a digital to analog convertor is operating with an acceptable measurement of accuracy.

According to another embodiment, a computer program product comprising a computer readable storage medium having program instructions embodied therewith, the program instructions executable by a processor to cause the processor to produce an analog signal, convert the analog signal to a digital conversion, and verify accuracy of the analog signal based on a comparison of the digital conversion and a reference signal. An advantage of such a computer program product is that the comparison of the digital conversion to the reference signal can be performed automatically, thereby reducing entity time to compare waveforms.

In some embodiments, the program instructions are further executable by the processor to cause the processor to determine validity of the analog signal based on a result of a comparison of the digital conversion to the reference signal. An advantage of such a computer program product is that it can automatically verify that a digital to analog convertor is operating with an acceptable measurement of accuracy.

Various other details of various embodiments described herein are presented in the following clauses.

CLAUSE 1: A system comprising: a digital to analog convertor configured to convert digital data to an analog signal; an analog to digital convertor configured to convert the analog signal to a digital conversion; a memory configured to store computer executable components; and a processor configured to execute the computer executable components stored in memory, wherein the computer executable components comprise: a waveform comparison component configured to verify accuracy of the analog signal based on a comparison of the digital conversion and a reference signal. An advantage of such a system is that the comparison of the digital conversion to the reference signal can be performed automatically, thereby reducing entity time to compare waveforms.

CLAUSE 2: The system of any preceding clause specified in the Summary, wherein the waveform comparison component is further configured to determine that the analog signal is valid based on a result of the comparison of the digital conversion to the reference signal.

CLAUSE 3: The system of any preceding clause specified in the Summary, wherein the waveform comparison component is further configured to assign a score to the digital conversion and to the reference signal and determine that the analog signal is valid based on the score being less than or equal to a defined threshold value.

CLAUSE 4: The system of any preceding clause specified in the Summary, wherein the waveform comparison component is further configured to generate a lag score based on a cross-correlation of the digital conversion and the reference signal.

CLAUSE 5: The system of any preceding clause specified in the Summary, wherein the reference signal comprises a set of manually verified data points.

CLAUSE 6: The system of any preceding clause specified in the Summary, wherein the waveform comparison component is further configured to compare one or more specified data points of the digital conversion to the reference signal.

CLAUSE 7: The system of any preceding clause specified in the Summary, wherein the computer executable components further comprise: a reference component configured to receive as input the reference signal and the one or more specified data points.

CLAUSE 8: A computer-implemented method comprising: producing, by a system operatively coupled to a processor, an analog signal; converting, by the system, the analog signal to a digital conversion; and verifying, by the system, accuracy of the analog signal based on a comparison of the digital conversion and a reference signal. An advantage of such a computer implemented method is that the comparison of the digital conversion to the reference signal can be performed automatically, thereby reducing entity time to compare waveforms.

CLAUSE 9: The computer-implemented method of any preceding clause specified in the Summary, further comprising: determining, by the system, validity of the analog signal based on a result of the comparing of the digital conversion to the reference signal.

CLAUSE 10: The computer-implemented method of any preceding clause specified in the Summary, further comprising: assigning, by the system, a score to the digital conversion and to the reference signal, and wherein the determining of the validity of the analog signal is based on the score being less than or equal to a defined threshold value.

CLAUSE 11: The computer-implemented method of any preceding clause specified in the Summary, further comprising: generating, by the system, a lag score based on a cross-correlation of the digital conversion and the reference signal.

CLAUSE 12: The computer-implemented method of any preceding clause specified in the Summary, wherein the reference signal comprises a set of manually verified data points.

CLAUSE 13: The computer-implemented method of any preceding clause specified in the Summary, wherein the comparing the digital conversion to the reference signal comprises comparing one or more specified data points of the digital conversion to the reference signal.

CLAUSE 14: The computer-implemented method of any preceding clause specified in the Summary, further comprising: receiving, by the system, the reference signal and the one or more specified data points of the digital conversion.

CLAUSE 15: A computer program product comprising a computer readable storage medium having program instructions embodied therewith, the program instructions executable by a processor to cause the processor to: produce, by the processor, an analog signal; convert, by the processor, the analog signal to digital conversion; and verify, by the processor, accuracy of the analog signal based on a comparison of the digital conversion and a reference signal. An advantage of such a computer program product is that the comparison of the digital conversion to the reference signal can be performed automatically, thereby reducing entity time to compare waveforms.

CLAUSE 16: The computer program product of any preceding clause specified in the Summary, wherein the program instructions are further executable by the processor to cause the processor to: determine, by the processor, validity of the analog signal based on a result of the comparison of the digital conversion to the reference signal.

CLAUSE 17: The computer program product of any preceding clause specified in the Summary, wherein the program instructions are further executable by the processor to cause the processor to: assign, by the processor, a score to the digital conversion and to the reference signal, and wherein a determination of the validity of the analog signal is based on the score being less than or equal to a defined threshold.

CLAUSE 18: The computer program product of any preceding clause specified in the Summary, wherein the program instructions are further executable by the processor to cause the processor to: generate, by the processor, a lag score based on a cross-correlation of the digital conversion and the reference signal.

CLAUSE 19: The computer program product of any preceding clause specified in the Summary, wherein the reference signal comprises a set of manually verified data points.

CLAUSE 20: The computer program product of any preceding clause specified in the Summary, wherein the program instructions are further executable by the processor to cause the processor to: receive, by the processor, the reference signal.

DETAILED DESCRIPTION

Figure 1:
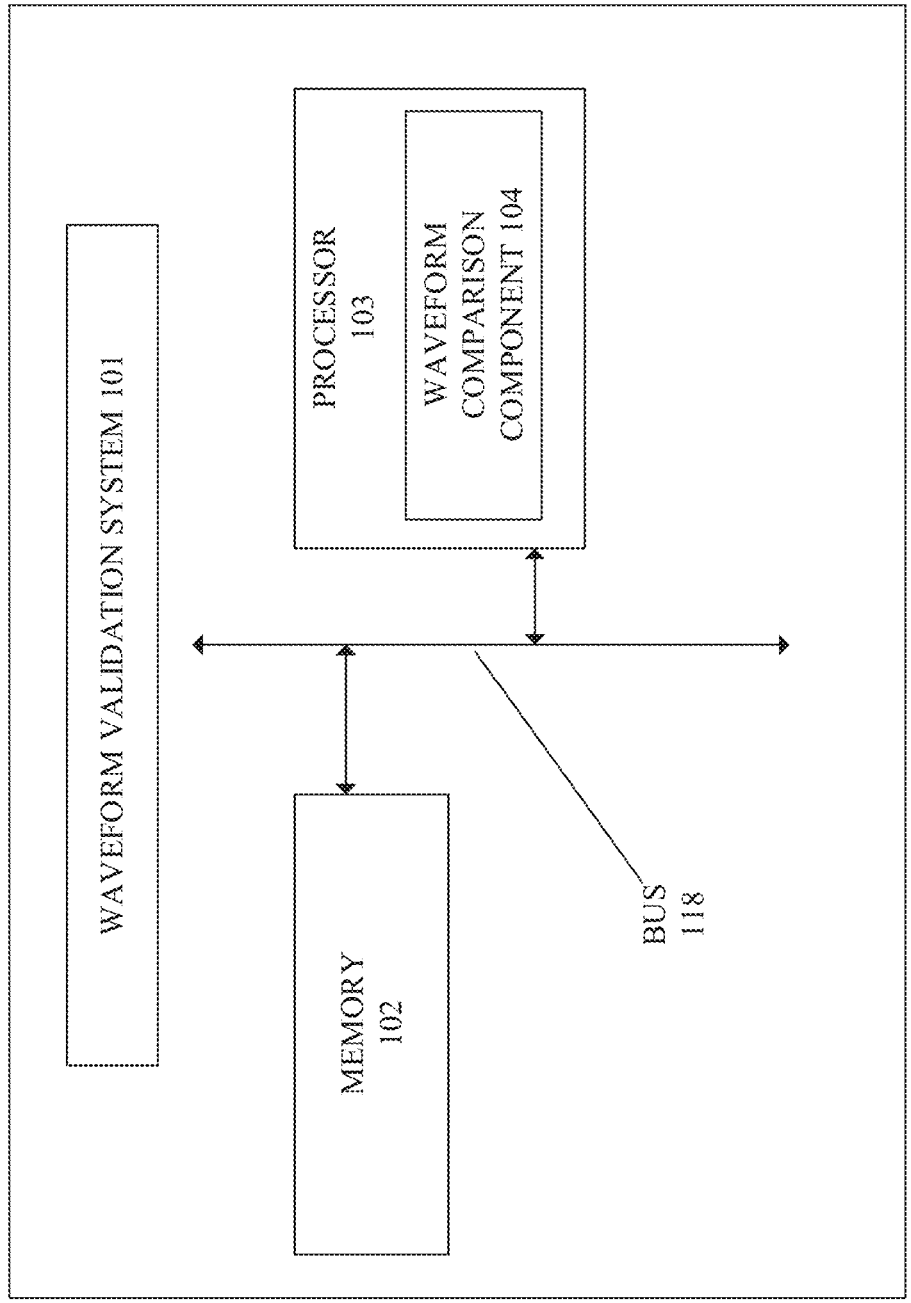
FIG. 1 illustrates a block diagram of an example, non-limiting system that can facilitate automatic validation of waveforms, in accordance with one or more embodiments described herein.
Figure 2:
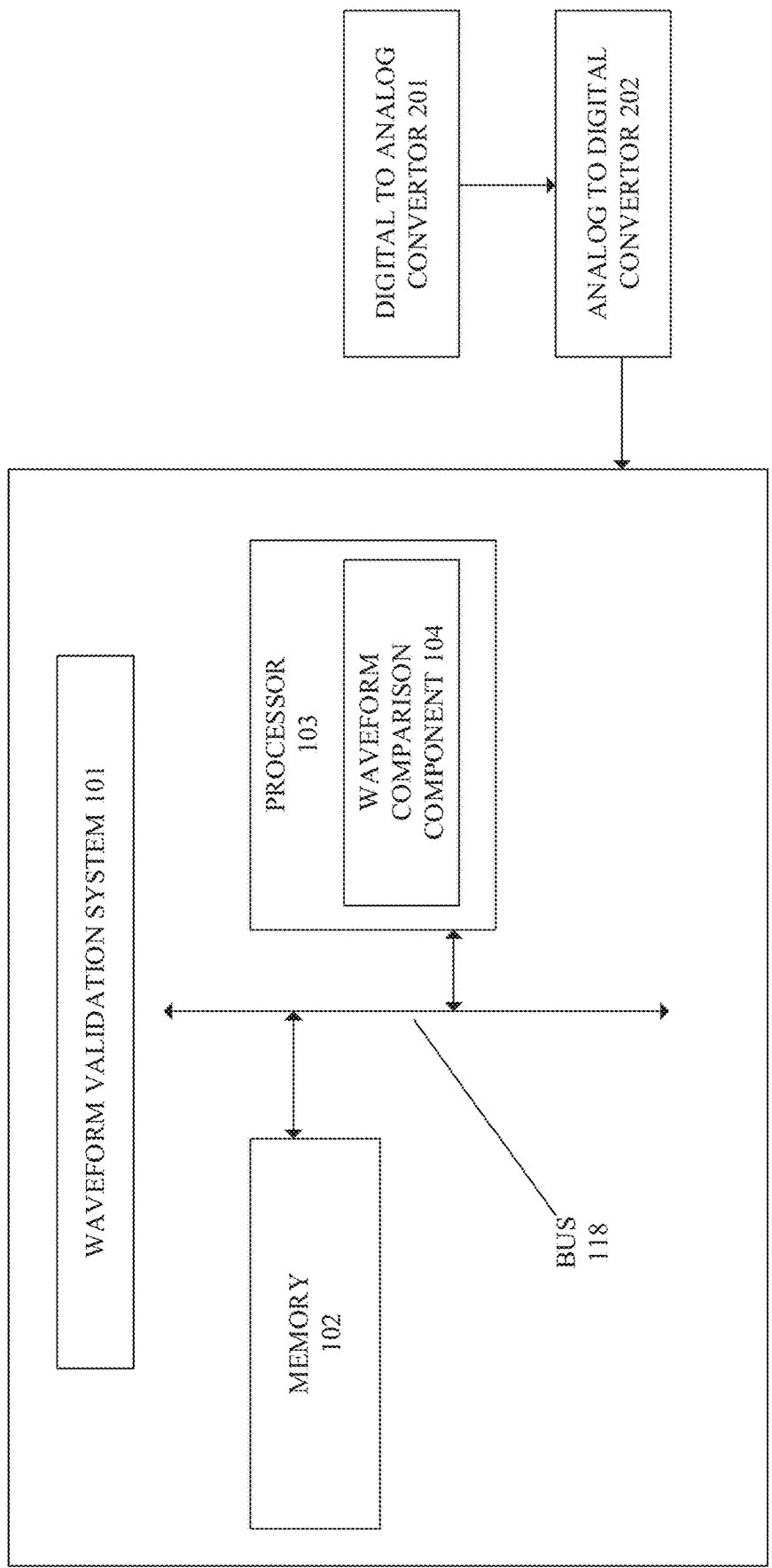
FIG. 2 illustrates a block diagram of an example, non-limiting system that can facilitate automatic validation of waveforms, in accordance with one or more embodiments described herein.
Figure 3:
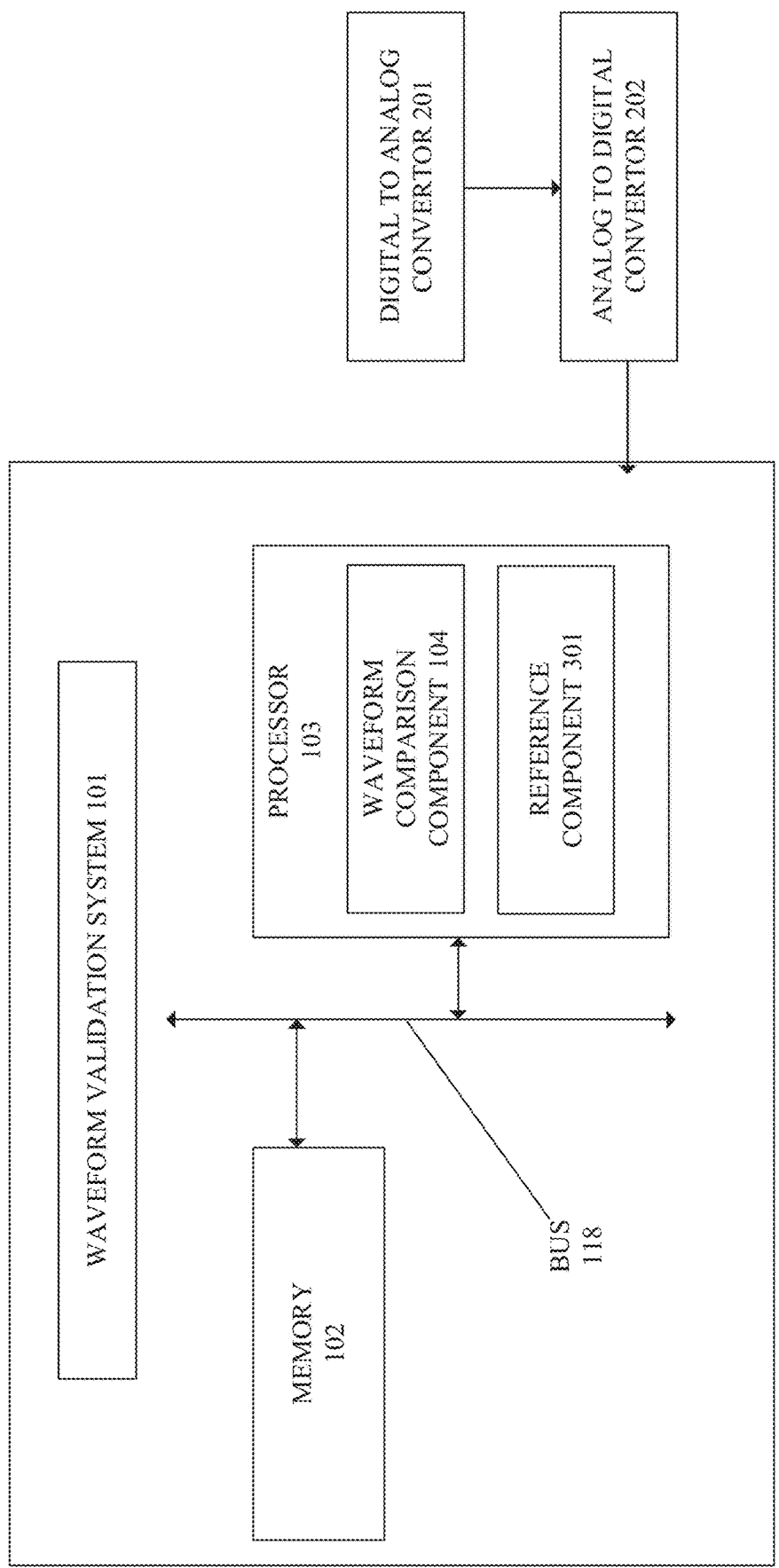
FIG. 3 illustrates a block diagram of an example, non-limiting system that can facilitate automatic validation of waveforms, in accordance with one or more embodiments described herein.
Figure 4:
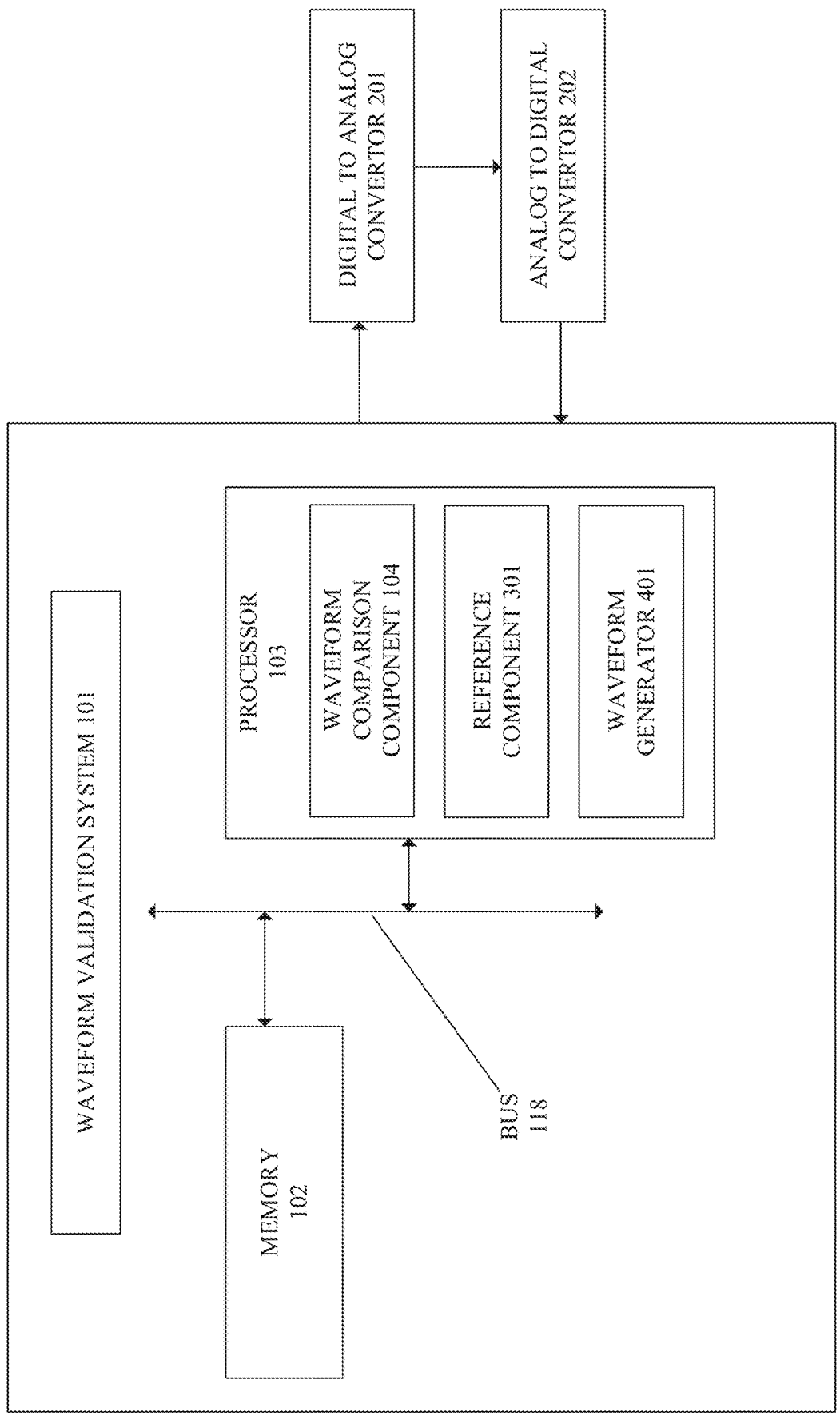
FIG. 4 illustrates a block diagram of an example, non-limiting system that can facilitate automatic validation of waveforms, in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

Validating time domain characteristics of an analog signal is often a manual process. For example, validation often involves using an oscilloscope to capture an image and then an entity performs an analysis based on a metric. The validation process often uses a significant amount of time and human resources to perform. However, an automated waveform validation process allows for automated hardware validation to ensure basic hardware functionality is maintained across logic changes. Automated validation can also allow for flexibility of minor amplitude and phase differences, which can be useful for experiments that call for lower standards of accuracy.

One or more embodiments are now described with reference to the drawings, where like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Given problems described above with existing waveform validation technologies, the present disclosure can be implemented to produce a solution to these problems in the form of systems, computer-implemented methods, and/or computer program products that can facilitate automatic waveform validation by: comparing a digital conversion of an analog signal to a reference signal. An advantage of such systems, computer-implemented methods, and/or computer program products is that the comparison of the digital conversion to the reference signal can be performed automatically, thereby reducing entity time used to compare waveforms.

In some embodiments, the present disclosure can be implemented to produce a solution to the problems described above in the form of systems, computer-implemented methods, and/or computer program products that can further automatic waveform validation by: determining validity of the analog signal based on a result of the comparison of the digital conversion to the reference signal. An advantage of such systems, computer-implemented methods, and/or computer program products is that they can be implemented to automatically verify that a digital to analog convertor is operating with an acceptable measurement of accuracy.

As referenced herein, an "entity" can comprise a human, a client, a user, a computing device, a software application, an agent, a machine learning (ML) model, an artificial intelligence (AI) model, and/or another entity.

FIGS. 1, 2, 3 and 4 illustrate block diagrams of an example, non-limiting waveform validation system 101 that can facilitate automatic validation of waveforms in accordance with one or more embodiments described herein. Waveform validation system 101 can comprise a memory 102, a processor 103, a bus 118 and a waveform comparison component 104. In some embodiments, waveform validation system 101 can further comprise a digital to analog convertor 201, an analog to digital convertor 202, a reference component 301, and/or a waveform generator 401.

It should be appreciated that the embodiments of the subject disclosure depicted in various figures disclosed herein are for illustration only, and as such, the architecture of such embodiments are not limited to the systems, devices, and/or components depicted therein. For example, in some embodiments, waveform validation system 101 can further comprise various computer and/or computing-based elements described herein with reference to operating environment 1100 and FIG. 11. In several embodiments, such computer and/or computing-based elements can be used in connection with implementing one or more of the systems, devices, components, and/or computer-implemented operations shown and described in connection with FIG. 1 and/or other figures disclosed herein.

Memory 102 can store one or more computer and/or machine readable, writable, and/or executable components and/or instructions that, when executed by processor 103 (e.g., a classical processor, a quantum processor, and/or another type of processor), can facilitate performance of operations defined by the executable component(s) and/or instruction(s). For example, memory 102 can store computer and/or machine readable, writable, and/or executable components and/or instructions that, when executed by processor 103, can facilitate execution of the various functions described herein relating to waveform comparison component 104, digital to analog convertor 201, analog to digital convertor 202, reference component 301, waveform generator 401, and/or any other component associated with waveform validation system 101.

Memory 102 can comprise volatile memory (e.g., random access memory (RAM), static RAM (SRAM), dynamic RAM (DRAM), and/or another type of volatile memory) and/or non-volatile memory (e.g., read only memory (ROM), programmable ROM (PROM), electrically programmable ROM (EPROM), electrically erasable programmable ROM (EEPROM), and/or another type of non-volatile memory) that can employ one or more memory architectures. Further examples of memory 102 are described below with reference to system memory 1116 and FIG. 11. Such examples of memory 102 can be employed to implement any embodiments of the subject disclosure.

Processor 103 can comprise one or more types of processors and/or electronic circuitry (e.g., a classical processor, a quantum processor, and/or another type of processor and/or electronic circuitry) that can implement one or more computer and/or machine readable, writable, and/or executable components and/or instructions that can be stored on memory 102. For example, processor 103 can perform various operations that can be specified by such computer and/or machine readable, writable, and/or executable components and/or instructions including, but not limited to, logic, control, input/output (I/O), arithmetic, and/or the like. In some embodiments, processor 103 can comprise one or more central processing unit, multi-core processor, microprocessor, dual microprocessors, microcontroller, System on a Chip (SOC), array processor, vector processor, quantum processor, and/or another type of processor. Further examples of processor 103 are described below with reference to processing unit 1114 and FIG. 11. Such examples of processor 103 can be employed to implement any embodiments of the subject disclosure.

Waveform validation system 101, memory 102, processor 103, waveform comparison component 104, reference component 301, waveform generator 401, digital to analog convertor 201, analog to digital convertor, and/or another component of waveform validation system 101 as described herein can be communicatively, electrically, operatively, and/or optically coupled to one another via bus 118 to perform functions of waveform validation system 101, and/or any components coupled therewith. Bus 118 can comprise one or more memory bus, memory controller, peripheral bus, external bus, local bus, a quantum bus, and/or another type of bus that can employ various bus architectures. Further examples of bus 118 are described below with reference to system bus 1118 and FIG. 11. Such examples of bus 118 can be employed to implement any embodiments of the subject disclosure.

Waveform validation system 101 can comprise any type of component, machine, device, facility, apparatus, and/or instrument that comprises a processor and/or can be capable of effective and/or operative communication with a wired and/or wireless network. All such embodiments are envisioned. For example, waveform validation system 101 can comprise a server device, a computing device, a general-purpose computer, a special-purpose computer, a quantum computing device (e.g., a quantum computer), a tablet computing device, a handheld device, a server class computing machine and/or database, a laptop computer, a notebook computer, a desktop computer, a cell phone, a smart phone, a consumer appliance and/or instrumentation, an industrial and/or commercial device, a digital assistant, a multimedia Internet enabled phone, a multimedia players, and/or another type of device.

Waveform validation system 101 can be coupled (e.g., communicatively, electrically, operatively, optically, and/or coupled via another type of coupling) to one or more external systems, sources, and/or devices (e.g., classical and/or quantum computing devices, communication devices, and/or another type of external system, source, and/or device) using a wire and/or a cable. For example, waveform validation system 101 can be coupled (e.g., communicatively, electrically, operatively, optically, and/or coupled via another type of coupling) to one or more external systems, sources, and/or devices (e.g., classical and/or quantum computing devices, communication devices, and/or another type of external system, source, and/or device) using a data cable including, but not limited to, a High-Definition Multimedia Interface (HDMI) cable, a recommended standard (RS) 232 cable, an Ethernet cable, and/or another data cable.

In some embodiments, waveform validation system 101 can be coupled (e.g., communicatively, electrically, operatively, optically, and/or coupled via another type of coupling) to one or more external systems, sources, and/or devices (e.g., classical and/or quantum computing devices, communication devices, and/or another type of external system, source, and/or device) via a network. For example, such a network can comprise wired and/or wireless networks, including, but not limited to, a cellular network, a wide area network (WAN) (e.g., the Internet) or a local area network (LAN). Waveform validation system 101 can communicate with one or more external systems, sources, and/or devices, for instance, computing devices using virtually any desired wired and/or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol, and/or other proprietary and non-proprietary communication protocols. Therefore, in some embodiments, waveform validation system 101 can comprise hardware (e.g., a central processing unit (CPU), a transceiver, a decoder, quantum hardware, a quantum processor, and/or other hardware), software (e.g., a set of threads, a set of processes, software in execution, quantum pulse schedule, quantum circuit, quantum gates, and/or other software) or a combination of hardware and software that can facilitate communicating information between waveform validation system 101 and external systems, sources, and/or devices (e.g., computing devices, communication devices, and/or another type of external system, source, and/or device).

Waveform validation system 101 can comprise one or more computer and/or machine readable, writable, and/or executable components and/or instructions that, when executed by processor 103 (e.g., a classical processor, a quantum processor, and/or another type of processor), can facilitate performance of operations defined by such component(s) and/or instruction(s). Further, in numerous embodiments, any component associated with waveform validation system 101, as described herein with or without reference to the various figures of the subject disclosure, can comprise one or more computer and/or machine readable, writable, and/or executable components and/or instructions that, when executed by processor 103, can facilitate performance of operations defined by such component(s) and/or instruction(s). For example, waveform comparison component 104, reference component 301, waveform generator 401, digital to analog convertor 201, analog to digital convertor 202, and/or any other components associated with waveform validation system 101 as disclosed herein (e.g., communicatively, electronically, operatively, and/or optically coupled with and/or employed by waveform validation system 101), can comprise such computer and/or machine readable, writable, and/or executable component(s) and/or instruction(s). Consequently, according to numerous embodiments, waveform validation system 101 and/or any components associated therewith as disclosed herein, can employ processor 103 to execute such computer and/or machine readable, writable, and/or executable component(s) and/or instruction(s) to facilitate performance of one or more operations described herein with reference to waveform validation system 101 and/or any such components associated therewith.

Waveform validation system 101 can facilitate (e.g., via processor 103) performance of operations executed by and/or associated with waveform comparison component 104, reference component 301, waveform generator 401, digital to analog convertor 201, analog to digital convertor 202, and/or another component associated with waveform validation system 101 as disclosed herein. For example, as described in detail below, waveform validation system 101 can facilitate (e.g., via processor 103): comparing a digital conversion of an analog signal to a reference signal. In another example, as described in detail below, waveform validation system 101 can further (e.g., via processor 103): determine validity of an analog signal based on a result of comparing the digital conversion of the analog signal to the reference signal.

Waveform comparison component 104 can be configured to verify accuracy of an analog signal based on a comparison of a digital conversion and a reference signal. For example, waveform comparison component 104 can receive a digital conversion of an analog signal and a reference signal. In an embodiment, the reference signal can comprise a digital conversion of a previously verified analog signal. For example, an analog signal can be manually verified by an entity and then a digital conversion of the manually verified signal can be stored by waveform comparison component 104 for future use. Digital conversions of analog signals can comprise a series of data points representing the amplitude of a waveform at various points in time. For example, a digital conversion can comprise a series of points, wherein an X-coordinate of a point represents a point in time and a Y-coordinate represents an amplitude of the analog signal. Accordingly, waveform comparison component 104 can compare the set of data points of the digital conversion of the analog signal to the set of data points of the reference signal in order to determine similarity between the two waveforms.

In an embodiment, waveform comparison component 104 can be configured to determine validity of the analog signal based on the comparison of the digital conversion of the analog signal to the reference signal. For example, an entity can provide an accuracy threshold to waveform comparison component 104. If the similarity between the digital conversion and the reference signal is within the threshold, then the analog signal can be determined to be valid. If the similarity between the digital conversion and the reference is not within the threshold, then the analog signal can be determined to be invalid.

In an embodiment, waveform comparison component 104 can be configured to generate a lag score based on a cross-correlation of the digital conversion and the reference signal. For example, the cross-correlation (e.g., a measure of similarity of two data sets as a measure of displacement relative to one and other) can produce a normalized lag score between 0 and 1 for each lag of the convolution, wherein the convolution (e.g., a function produced by the cross-correlation of the digital conversion and the reference signal), and wherein the higher the normalized lag score (e.g., scaled so that the values fall between 0 and 1), the greater the similarity between points of the digital conversion and the reference signal at that lag value (e.g., similarity of amplitudes between points). Accordingly, a lag score of 1 can correspond to an exact match between the digital conversion and the reference signal at that lag value. In an embodiment, the lag score can be utilized as a measurement of similarity. For example, waveform comparison component 104 can determine an average of all lag scores of the comparison, wherein the average represents an overall similarity between the digital conversion and the reference signal. For example, an average lag score of 0.9 can represent an overall similarity of 90%. In another embodiment, the lag score can be compared against a threshold to determine validity of the analog signal. For example, if the threshold specifies a lag score of 0.9 or greater, a lag score of 0.95 would be valid, while a lag score of 0.85 would be invalid.

In a further embodiment, waveform comparison component 104 can be configured to compare one or more specific points of interest between the digital conversion and the reference signal. For example, waveform comparison component 104 can determine the point with the highest lag score and compare the lag score of the point to the threshold. For example, if the highest lag score for a point of the comparison is 0.99, then waveform comparison component 104 can compare the lag score of 0.99 to a threshold. In this embodiment, by analyzing the point at which the comparison between the digital conversion and the reference signal produces the highest lag score (e.g., the point with the most similarity) waveform comparison component 104 can detect amplitude variations between the digital conversion and the reference signal. In another embodiment, waveform comparison component 104 can be configured to compare one or more specific points of the digital conversion and the reference signal lag scores. For example, the waveform comparison component 104 can compare points of the digital conversion and the reference signal with the same time coordinate. In this embodiment, the lag score would then measure a time delay between the digital conversion and the reference signal, which can represent a phase variation between the two waveforms.

Digital to analog convertor (DAC) 201 can be configured to convert a series of digital data points to an analog signal. For example, DAC 201 can receive a series of digital data points representing a waveform, such as those produced by waveform generator 401, and output an analog signal based on the data points. However, DACs can be susceptible to hardware failures, wherein a DAC, such as DAC 201, may not produce an appropriate analog signal from the digital data points. Analog to digital convertor (ADC) 202 can be configured to capture the analog signal and produce a digital conversion of the analog signal. The digital conversion can then be passed to waveform comparison component 104 to perform a comparison and analysis as described above. For example, if waveform comparison component 104 determines that the analog signal produced by DAC 201 is invalid, then waveform comparison component 104 can output a notification to an entity that DAC 201 is not operating properly. Similarly, if waveform comparison component 104 determines that the analog signal produced by DAC 201 is valid, then waveform comparison component 104 can output a notification to an entity that DAC 201 is operating properly.

Reference component 301 can be configured to receive as input a reference signal and comparison criteria, such as those described above. For example, reference component 301 can receive digital data representing a manually verified reference signal, a threshold for a validity comparison, and a type of analyzing, such as an average lag score analysis, an analysis of specific points of interest, or a maximum lag score comparison, as described above. Reference component 301 can then pass these inputs to waveform comparison component 104 to utilize.

Waveform generator 401 can be configured to generate a set of data points representing a waveform function and pass the data points to DAC 201. For example, waveform generator 401 can receive as input a waveform function for an intended waveform. Waveform generator 401 can then generate a series of data points representing the waveform, which can be passed to DAC 201 to convert into an analog signal.

Figure 5:
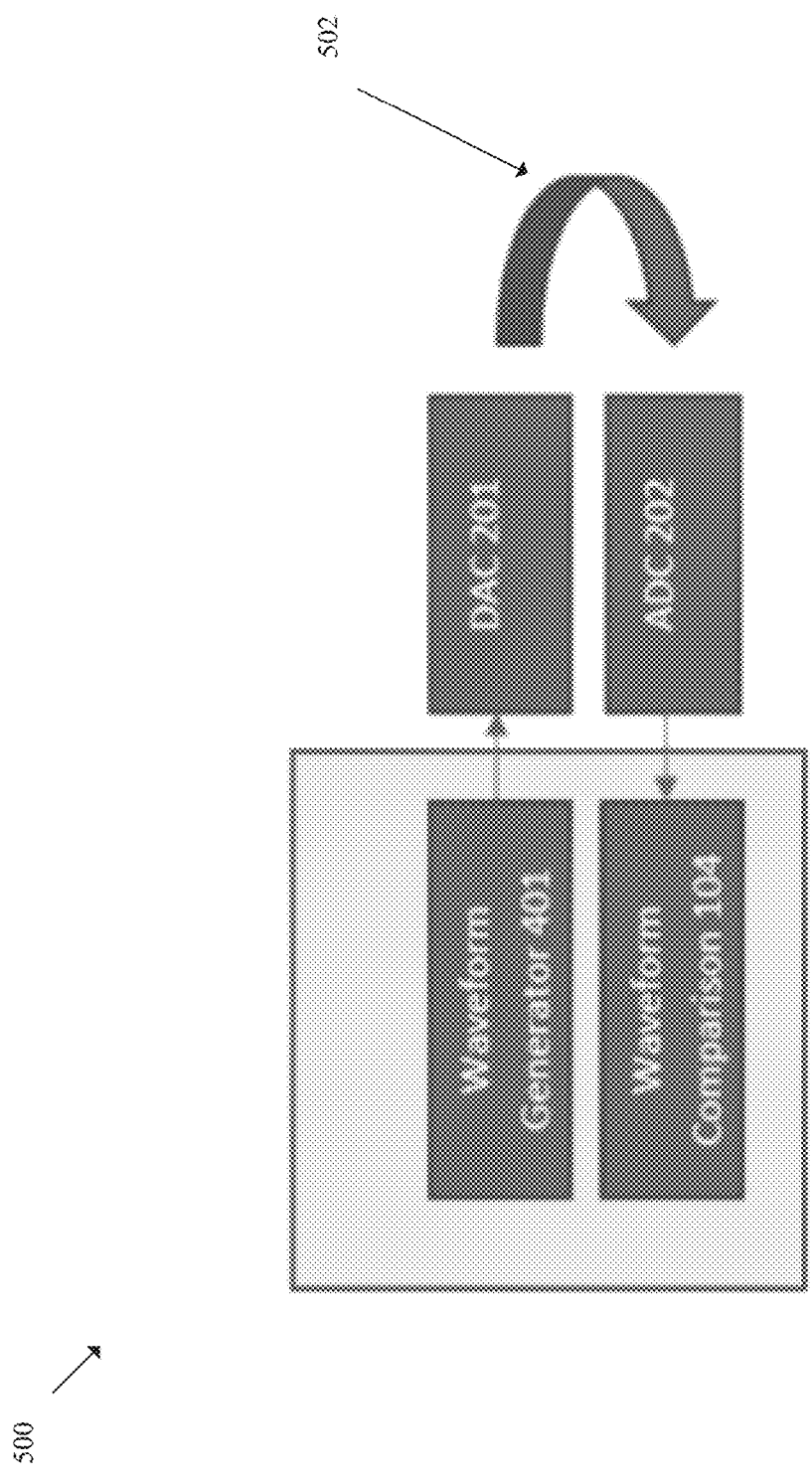
FIG. 5 illustrates a block diagram of an example, non-limiting system that can perform automated waveform validation, in accordance with one or more embodiments described herein.

FIG. 5 illustrates a block diagram of a system 500 which can perform automated waveform validation, in accordance with one or more embodiments described herein. Repetitive description of like elements and/or processes employed in respective embodiments is omitted for sake of brevity.

In an embodiment, system 500 can comprise waveform generator 401, waveform comparison component 104, digital to analog convertor (DAC) 201 and analog to digital convertor (ADC) 202. For example, waveform generator 401 can produce digital data representing a waveform. The digital data can then be passed to DAC 201, which converts the digital data into an analog signal 502. ADC 202 can then convert the analog signal 502 into a digital representation, which can be passed to waveform comparison component 104. Waveform comparison component 104 can then store the incoming data and perform analysis on it.

For example, waveform comparison component 104 can compare the digital representation to a manually verified set of previously captured data. The comparison can be made using a cross-correlation algorithm that produces a normalized lag score between 0 and 1 for each lag of the convolution. A normalized lag score of 1 corresponds to an exact match at that lag value. This vector of scores can then be compared against specified thresholds to determine if the test was successful or not. In an embodiment, the max score can be compared against a threshold value. In this embodiment, the point with the closest match to the manually verified data is analyzed, which can be utilized to detect amplitude variations. In another embodiment, a specific point or points out of the lag score vector can be utilized. This allows for a comparison of points which may be time delayed and can be utilized to detect phase variations. In an embodiment, the manually verified set of previously captured data can be limited to points of interest of the waveform. For example, rather than comprising data point representing a full waveform, in an embodiment, the manually verified set of previously captured data can comprise only data points representing a region of interest of a waveform.

Figure 6:
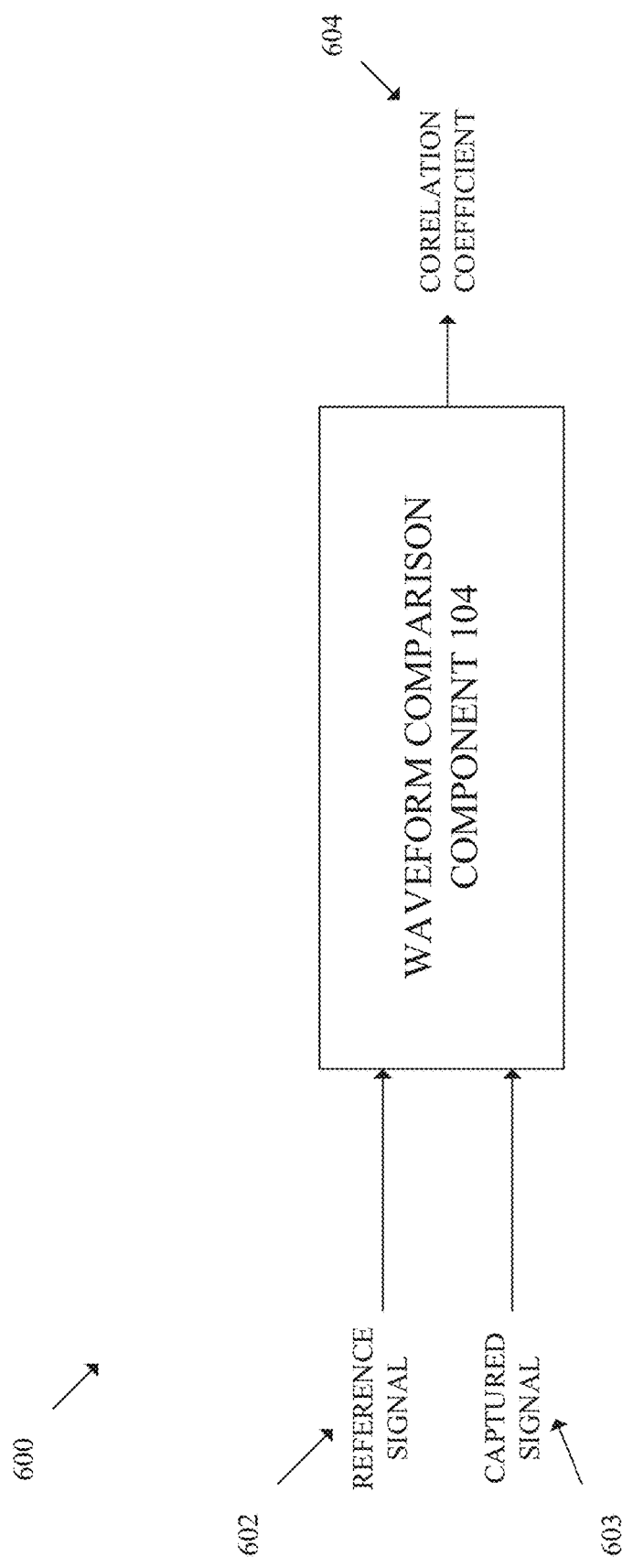
FIG. 6 illustrates a block diagram of an example method of automatic waveform validation, in accordance with one or more embodiments as described herein.

FIG. 6 illustrates a block diagram of an example method 600 of automatic waveform validation, in accordance with one or more embodiments as described herein. Repetitive description of like elements and/or processes employed in respective embodiments is omitted for sake of brevity.

For example, waveform comparison component 104 can receive a reference signal 602 and a captured signal 603. In an embodiment, the reference signal can comprise a set of data points representing a manually verified analog signal. Captured signal 603 can comprise a digital conversion of an analog signal, such as that produced by ADC 202. Waveform comparison component 104 can then determine a correlation coefficient 604 between the reference signal 602 and the captured signal 603, as described above in relation to FIGS. 1-4.

Figure 7:
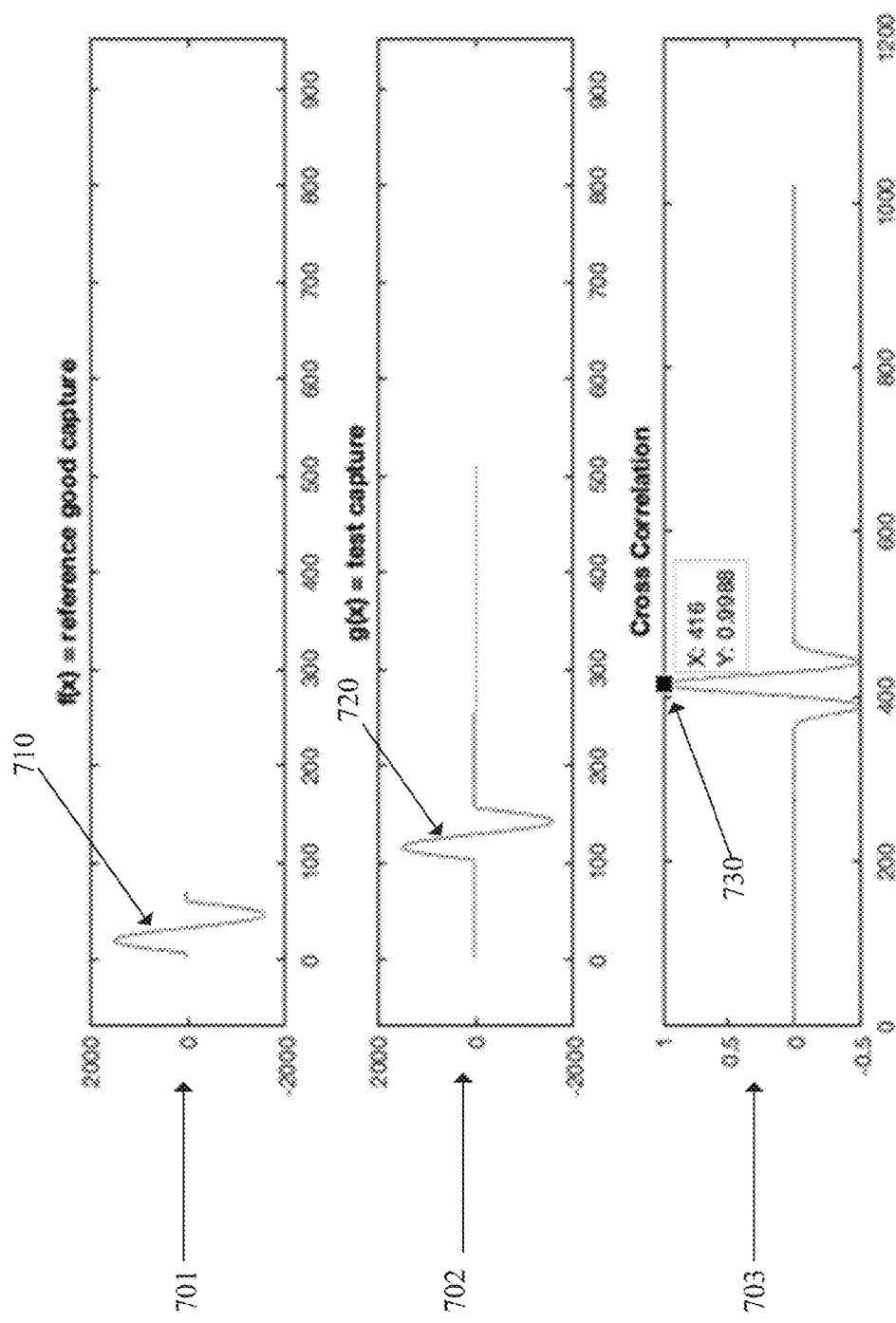
FIG. 7 illustrates graphs showing results of an example of automated waveform validation, in accordance with one or more embodiments described herein.

FIG. 7 illustrates graphs 701, 702 and 703 showing an example of automated waveform validation, in accordance with one or more embodiments described herein. Repetitive description of like elements and/or processes employed in respective embodiments is omitted for sake of brevity.

Graph 701 illustrates an example of a manually verified waveform 710. In an embodiment, waveform 710 can be stored as digital data that has been previously manually verified to ensure accuracy. Graph 702 illustrates an example test waveform 720. For example, as described above in detail, waveform generator 401 can generate data points representing a waveform which can be passed to DAC 201. DAC 201 can then convert the digital data points to an analog signal. The analog signal can then be converted by ADC 202 into a digital representation of test waveform 720. Graph 703 illustrates the results of an analysis of waveforms 710 and 720. For example, waveform comparison component 104 can perform a comparison of waveforms 710 and 720 utilizing a cross-correlation algorithm. As shown, by the Y value of point 730, the normalized lag score of the comparison between waveforms 710 and 720 is 0.9988, or an accuracy of 99.88%. Waveform comparison component 104 can then compare the normalized lag score to an accuracy threshold. For example, if the accuracy threshold is 99% accuracy, then waveform 720 is acceptable, as the normalized lag score is within the accuracy threshold.

Figure 8:
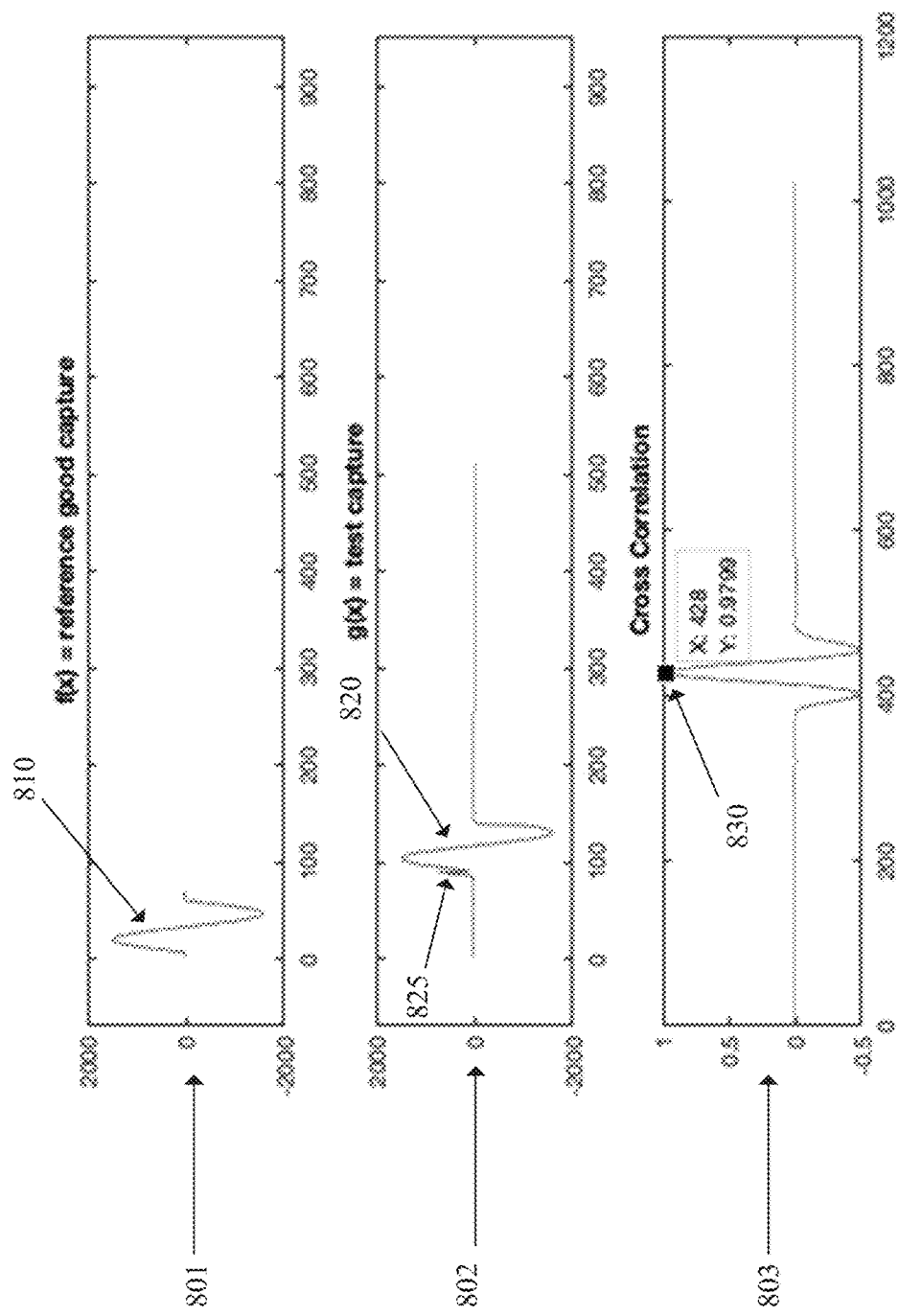
FIG. 8 illustrates graphs showing results of an example of automated waveform validation, in accordance with one or more embodiments described herein.

FIG. 8 illustrates graphs 801, 802 and 803 showing an example of automated waveform validation, in accordance with one or more embodiments described herein. Repetitive description of like elements and/or processes employed in respective embodiments is omitted for sake of brevity.

Graph 801 illustrates an example of a manually verified waveform 810. In an embodiment, waveform 810 can be stored as digital data that has been previously manually verified to ensure accuracy. Graph 802 illustrates an example test waveform 820. For example, as described above in detail, waveform generator 401 can generate data points representing a waveform which can be passed to DAC 201. DAC 201 can then convert the digital data points to an analog signal. The analog signal can then be converted by ADC 202 into a digital representation of waveform 820. As shown, waveform 820 has a minor error 825, due to the calibration of the DAC 201. Graph 803 illustrates the results of an analysis of waveforms 810 and 820. For example, waveform comparison component 104 can perform a comparison of waveforms 810 and 820 utilizing a cross-correlation algorithm. As shown, by the Y value of point 830, the normalized lag score of the comparison between waveforms 810 and 820 is 0.9799, or an accuracy of 97.99%. Waveform comparison component 104 can then compare the normalized lag score to an accuracy threshold. For example, if the accuracy threshold is 99% accuracy, then waveform 820 is not acceptable, as the normalized lag score is outside the accuracy threshold. However, it should be appreciated that the accuracy threshold can be set to account for minor errors that will not impact the use of the waveform. For example, if the accuracy threshold is 90%, then waveform 820 is acceptable.

Figure 9:
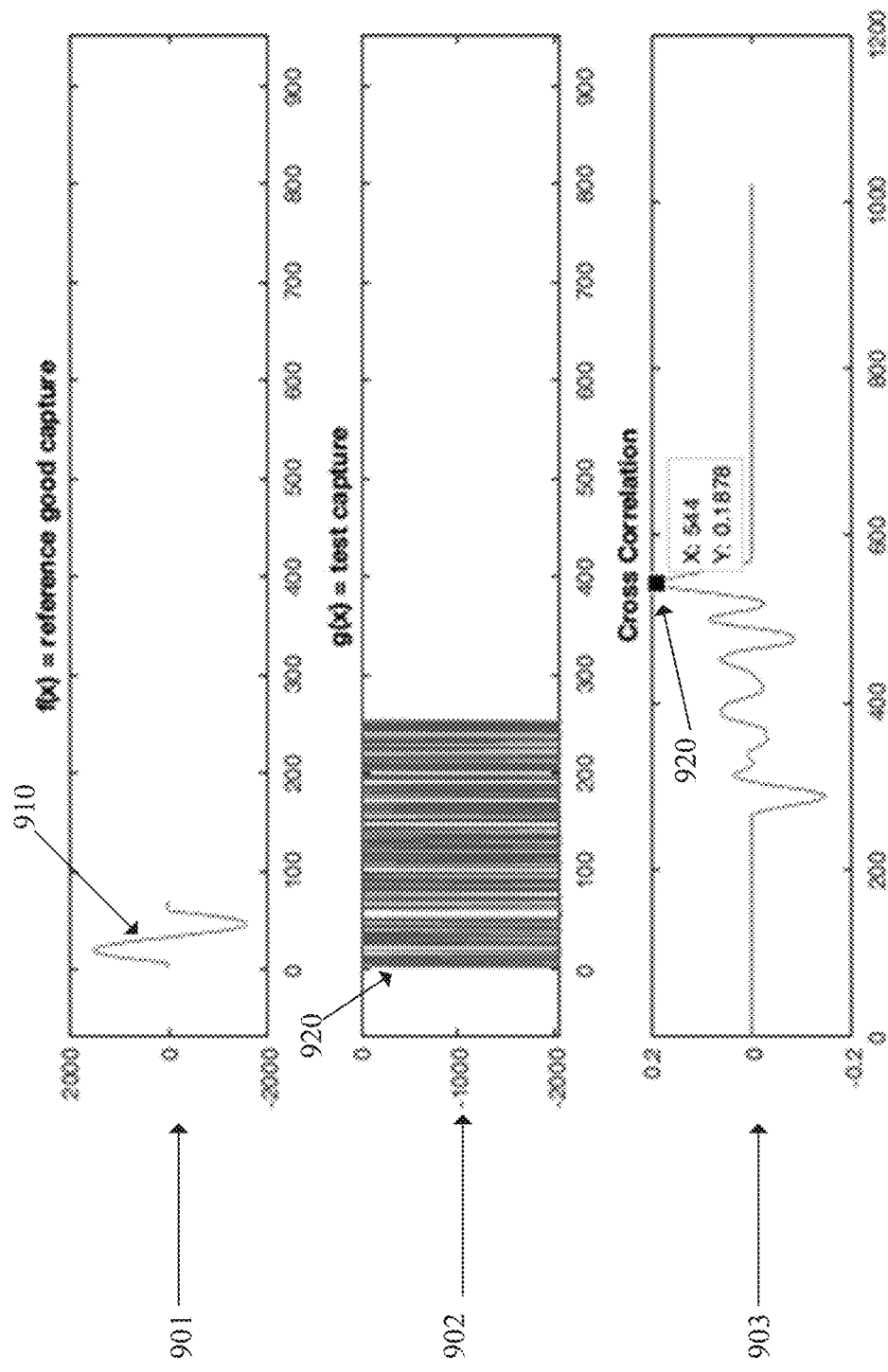
FIG. 9 illustrates graphs showing results of an example of automated waveform validation, in accordance with one or more embodiments described herein.

FIG. 9 illustrates graphs 901, 902 and 903 showing an example of automated waveform validation, in accordance with one or more embodiments described herein. Repetitive description of like elements and/or processes employed in respective embodiments is omitted for sake of brevity.

Graph 901 illustrates an example of a manually verified waveform 910. In an embodiment, waveform 910 can be stored as digital data that has been previously manually verified to ensure accuracy. Graph 902 illustrates an example test waveform 920. For example, as described above in detail, waveform generator 401 can generate data points representing a waveform which can be passed to DAC 201. DAC 201 can then convert the digital data points to an analog signal. As shown, by graph 902, waveform 920 is highly different from manually verified waveform 910. The analog signal can then be converted by ADC 202 into a digital representation of waveform 920. Graph 903 illustrates the results of an analysis of waveforms 910 and 920. For example, waveform comparison component 104 can perform a comparison of waveforms 910 and 920 utilizing a cross-correlation algorithm. As shown, by the Y value of point 930, the normalized lag score of the comparison between waveforms 910 and 920 is 0.1878, or an accuracy of 18.78%. Waveform comparison component 104 can then compare the normalized lag score to an accuracy threshold. For example, if the accuracy threshold is 99% accuracy, then waveform 920 is acceptable as the normalized lag score is not within the accuracy threshold. Accordingly, waveform 920 is not acceptable.

Figure 10:
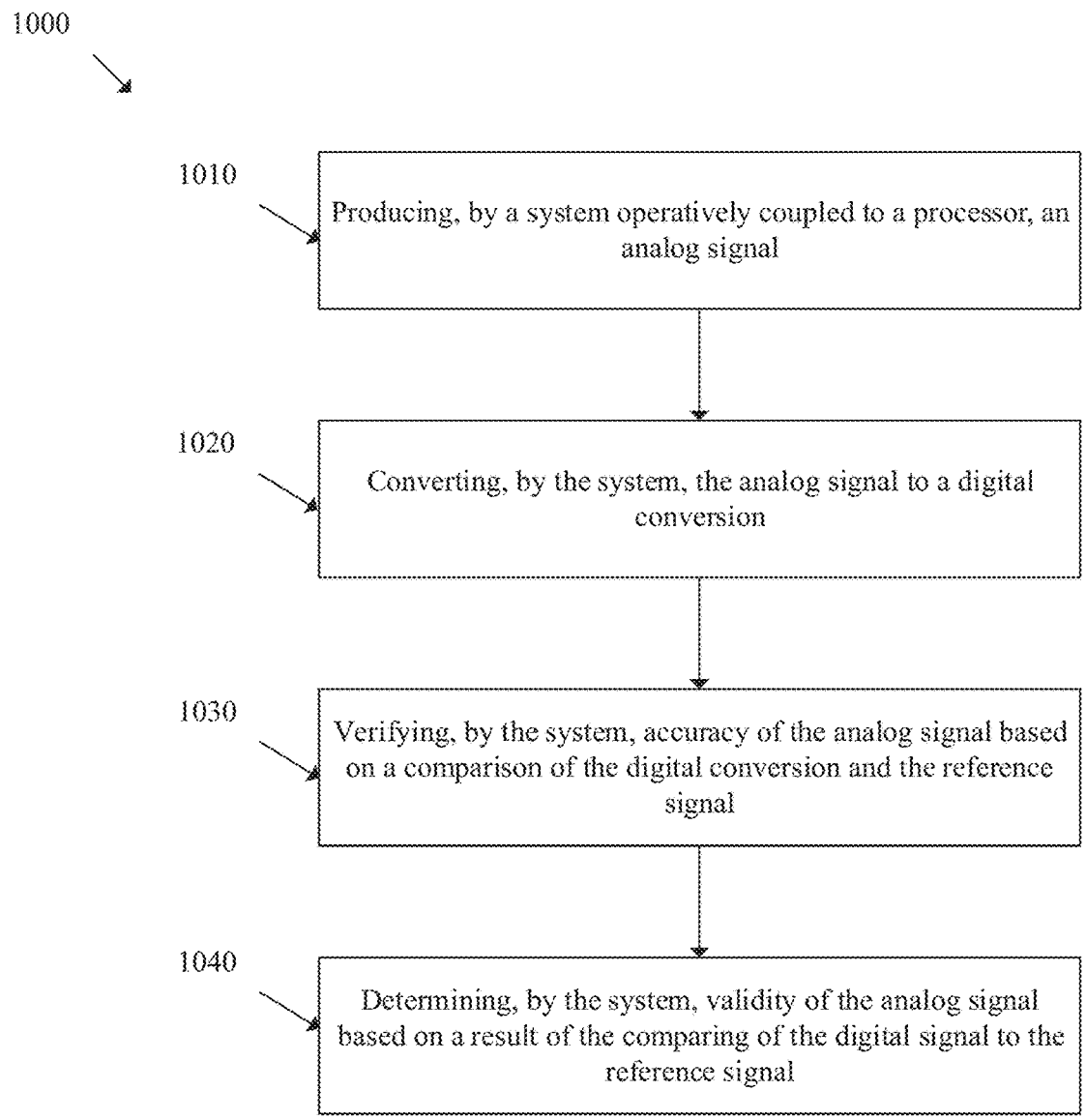
FIG. 10 illustrates a flow diagram of an example, non-limiting computer-implemented method that can facilitate automatic waveform validation, in accordance with one or more embodiments described herein.

FIG. 10 illustrates a flow diagram of an example, non-limiting computer-implemented method 1000 that can facilitate automatic validation of waveforms, in accordance with one or more embodiments described herein. Repetitive description of like elements and/or processes employed in respective embodiments is omitted for sake of brevity.

At 1010, computer-implemented method 1000 can comprise producing, by a system (e.g., waveform validation system 101, waveform generator 401 and/or DAC 201) operatively coupled to a processor (e.g., processor 103), an analog signal of a waveform.

At 1020, computer-implemented method 1000 can comprise converting, by the system (e.g., waveform validation system 101 and/or ADC 202), the analog signal to a digital conversion.

At 1030, computer-implemented method 1000 can comprise verifying, by the system (e.g., waveform validation system 101 and/or waveform comparison component 104) accuracy of the analog signal based on a comparison of the digital conversion and the reference signal. For example, as described above in reference to FIGS. 1-4, waveform comparison component 104 can utilize a cross-correlation algorithm to produce a normalized lag score between 0 and 1 for each lag of the convolution of the digital conversion and the reference signal.

At 1040, computer-implemented method 1000 can comprise determining, by the system, validity of the analog signal based on a result of the comparing of the digital conversion to the reference signal. For example, as described above in detail in reference to FIGS. 1-4, a maximum lag score can be compared against a threshold, where if the maximum lag score is within the threshold, then the analog signal is determined to be valid. In another example, one or more consistent points of the lag scores can be compared against a threshold, where if the lag scores of the one or more consistent points are within the threshold, then the analog signal is determined to be valid.

Waveform validation system 101 can provide technical improvements to a processing unit associated with waveform validation system 101. For example, by determining validity of a waveform based on a point of maximum similarity, or based on one or more specified points, waveform validation system 101 can reduce the number of data point comparisons utilized to determine validity of a waveform, thereby reducing the workload of a processing unit (e.g., processor 103) that is employed to execute the routines (e.g., instructions and/or processing threads) involved in waveform validation. In this example, by reducing the workload of such a processing unit (e.g., processor 103), waveform validation system 101 can thereby facilitate improved performance, improved efficiency, and/or reduced computational cost associated with such a processing unit.

A practical application of waveform validation system 101 is that it allows for automated validation of waveforms, therefore validating that hardware, such as digital to analog convertors, is working properly without the need for human time and resources.

Waveform validation system 101 can employ hardware and/or software to solve problems that are highly technical in nature, that are not abstract and that cannot be performed as a set of mental acts by a human. For example, a human mind cannot produce an analog waveform signal from digital data or convert an analog signal to a digital conversion. In some embodiments, one or more of the processes described herein can be performed by one or more specialized computers (e.g., a specialized processing unit, a specialized classical computer, a specialized quantum computer, and/or another type of specialized computer) to execute defined tasks related to the various technologies identified above. Waveform validation system 101 and/or components thereof, can be employed to solve new problems that arise through advancements in technologies mentioned above, employment of quantum computing systems, cloud computing systems, computer architecture, and/or another technology.

It is to be appreciated that waveform validation system 101 can utilize various combinations of electrical components, mechanical components, and circuitry that cannot be replicated in the mind of a human or performed by a human as the various operations that can be executed by waveform validation system 101 and/or components thereof as described herein are operations that are greater than the capability of a human mind. For instance, the amount of data processed, the speed of processing such data, or the types of data processed by waveform validation system 101 over a certain period of time can be greater, faster, or different that the amount, speed, or data type that can be processed by a human mind over the same period of time.

According to several embodiments, waveform validation system 101 can also be fully operational towards performing one or more other functions (e.g., fully powered one, fully executed, and/or another function) while also performing the various operations described herein. It should be appreciated that such simultaneous multi-operational execution is beyond the capability of a human mind. It should also be appreciated that waveform validation system 101 can include information that is impossible to obtain manually by an entity, such as a human user. For example, the type, amount, and/or variety of information included in waveform validation system 101, waveform comparison component 104, reference component 301, waveform generator 401, DAC 201 and/or ADC 202 can be more complex than information obtained manually by an entity, such as a human user.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 11:
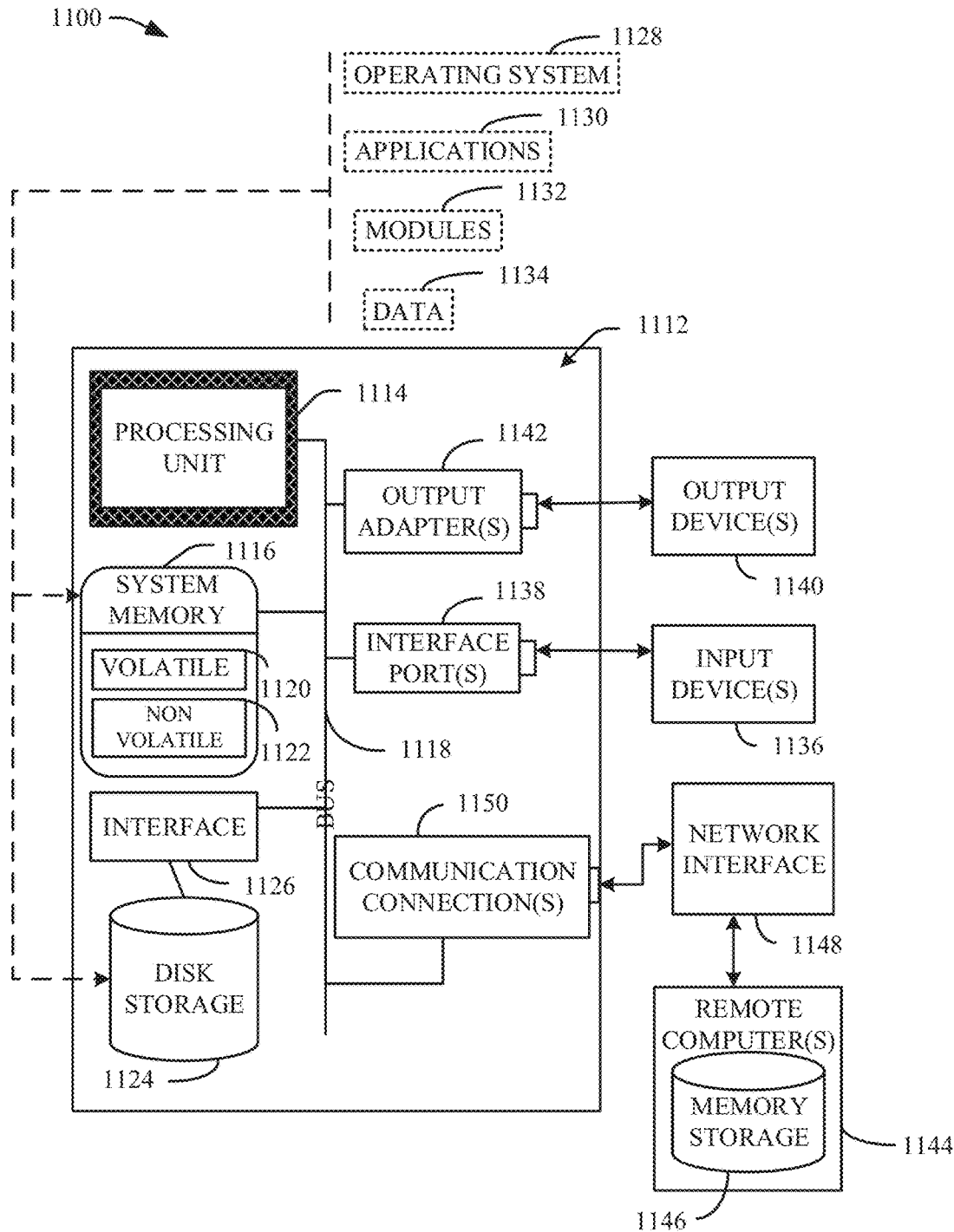
FIG. 11 illustrates a block diagram of an example, non-limiting operating environment in which one or more embodiments described herein can be facilitated.

With reference to FIG. 11, a suitable operating environment 1100 for implementing various aspects of this disclosure can also include a computer 1112. The computer 1112 can also include a processing unit 1114, a system memory 1116, and a system bus 1118. The system bus 1118 couples system components including, but not limited to, the system memory 1116 to the processing unit 1114. The processing unit 1114 can be any of various available processors. Dual microprocessors and other multiprocessor architectures also can be employed as the processing unit 1114. The system bus 1118 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 13114), and Small Computer Systems Interface (SCSI).

The system memory 1116 can also include volatile memory 1120 and nonvolatile memory 1122. The basic input/output system (BIOS), containing the basic routines to transfer information between elements within the computer 1112, such as during start-up, is stored in nonvolatile memory 1122. Computer 1112 can also include removable/non-removable, volatile/non-volatile computer storage media. FIG. 11 illustrates, for example, a disk storage 1124. Disk storage 1124 can also include, but is not limited to, devices like a magnetic disk drive, floppy disk drive, tape drive, Jaz drive, Zip drive, LS-100 drive, flash memory card, or memory stick. The disk storage 1124 also can include storage media separately or in combination with other storage media. To facilitate connection of the disk storage 1124 to the system bus 1118, a removable or non-removable interface is typically used, such as interface 1126. FIG. 11 also depicts software that acts as an intermediary between users and the basic computer resources described in the suitable operating environment 1100. Such software can also include, for example, an operating system 1128. Operating system 1128, which can be stored on disk storage 1124, acts to control and allocate resources of the computer 1112.

System applications 1130 take advantage of the management of resources by operating system 1128 through program modules 1132 and program data 1134, e.g., stored either in system memory 1116 or on disk storage 1124. It is to be appreciated that this disclosure can be implemented with various operating systems or combinations of operating systems. A user enters commands or information into the computer 1112 through input device(s) 1136. Input devices 1136 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1114 through the system bus 1118 via interface port(s) 1138. Interface port(s) 1138 include, for example, a serial port, a parallel port, a game port, and a universal serial bus (USB). Output device(s) 1140 use some of the same type of ports as input device(s) 1136. Thus, for example, a USB port can be used to provide input to computer 1112, and to output information from computer 1112 to an output device 1140. Output adapter 1142 is provided to illustrate that there are some output devices 1140 like monitors, speakers, and printers, among other output devices 1140, which require special adapters. The output adapters 1142 include, by way of illustration and not limitation, video and sound cards that provide a means of connection between the output device 1140 and the system bus 1118. It should be noted that other devices and/or systems of devices provide both input and output capabilities such as remote computer(s) 1144.

Computer 1112 can operate in a networked environment using logical connections to one or more remote computers, such as remote computer(s) 1144. The remote computer(s) 1144 can be a computer, a server, a router, a network PC, a workstation, a microprocessor based appliance, a peer device or other common network node and the like, and typically can also include many or all of the elements described relative to computer 1112. For purposes of brevity, only a memory storage device 1146 is illustrated with remote computer(s) 1144. Remote computer(s) 1144 is logically connected to computer 1112 through a network interface 1148 and then physically connected via communication connection 1150. Network interface 1148 encompasses wire and/or wireless communication networks such as local-area networks (LAN), wide-area networks (WAN), cellular networks, and/or another wire and/or wireless communication network. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1150 refers to the hardware/software employed to connect the network interface 1148 to the system bus 1118. While communication connection 1150 is shown for illustrative clarity inside computer 1112, it can also be external to computer 1112. The hardware/software for connection to the network interface 1148 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, and/or other program modules that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, handheld computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, where the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system comprising:
   a digital to analog convertor configured to convert digital data to an analog signal;
   an analog to digital convertor configured to convert the analog signal to a digital conversion;
   a memory configured to store computer executable components; and
   a processor configured to execute the computer executable components stored in memory, wherein the computer executable components comprise:
      a waveform comparison component configured to verify accuracy of the analog signal based on a comparison of the digital conversion and a reference signal, determine that the analog signal is valid based on a result of the comparison of the digital conversion to the reference signal, and assign a score to the digital conversion and to the reference signal, wherein the analog signal is valid based on the score being less than or equal to a defined threshold value.

2. The system of claim 1, wherein the waveform comparison component is further configured to generate a lag score based on a cross-correlation of the digital conversion and the reference signal.

3. The system of claim 1, wherein the reference signal comprises a set of manually verified data points.

4. The system of claim 1, wherein the waveform comparison component is further configured to compare one or more specified data points of the digital conversion to the reference signal.

5. The system of claim 4, wherein the computer executable components further comprise:
   a reference component configured to receive as input the reference signal and the one or more specified data points.

6. A computer-implemented method comprising:
   producing, by a system operatively coupled to a processor, an analog signal;
   converting, by the system, the analog signal to a digital conversion;

verifying, by the system, accuracy of the analog signal based on a comparison of the digital conversion and a reference signal; and determining, by the system, validity of the analog signal based on a result of the comparison of the digital conversion to the reference signal; and assigning, by the system, a score to the digital conversion and to the reference signal, wherein the determining the validity of the analog signal is based on the score being less than or equal to a defined threshold value.

7. The computer-implemented method of claim 6, further comprising:

generating, by the system, a lag score based on a cross-correlation of the digital conversion and the reference signal.

8. The computer-implemented method of claim 6, wherein the reference signal comprises a set of manually verified data points.

9. The computer-implemented method of claim 6, wherein the comparing the digital conversion to the reference signal comprises comparing one or more specified data points of the digital conversion to the reference signal.

10. The computer-implemented method of claim 9, further comprising:

receiving, by the system, the reference signal and the one or more specified data points of the digital conversion.

11. A computer program product comprising a computer readable storage medium having program instructions embodied therewith, the program instructions executable by a processor to cause the processor to:

produce, by the processor, an analog signal;

convert, by the processor, the analog signal to digital conversion; and verify, by the processor, accuracy of the analog signal based on a comparison of the digital conversion and a reference signal;

determine, by the processor, validity of the analog signal based on a result of the comparison of the digital conversion to the reference signal; and assign, by the processor, a score to the digital conversion and to the reference signal, wherein the determination of the validity of the analog signal is based on the score being less than or equal to a defined threshold value.

12. The computer program product of claim 11, wherein the program instructions are further executable by the processor to cause the processor to:

generate, by the processor, a lag score based on a cross-correlation of the digital conversion and the reference signal.

13. The computer program product of claim 11, wherein the reference signal comprises a set of manually verified data points.

14. The computer program product of claim 11, wherein the program instructions are further executable by the processor to cause the processor to:

receive, by the processor, the reference signal.

* * * * *